(12) United States Patent
Shimizu et al.

(10) Patent No.: US 6,171,437 B1
(45) Date of Patent: Jan. 9, 2001

(54) SEMICONDUCTOR MANUFACTURING DEVICE

(75) Inventors: Nobuhiro Shimizu; Akira Inoue; Yoshiharu Shirakawabe, all of Chiba (JP)

(73) Assignee: Seiko Instruments Inc. (JP)

(*) Notice: Under 35 U.S.C. 154(b), the term of this patent shall be extended for 0 days.

(21) Appl. No.: 09/197,585

(22) Filed: Nov. 23, 1998

(30) Foreign Application Priority Data

Nov. 20, 1997 (JP) .................................................... 9-320187

(51) Int. Cl.⁷ ...................................................... H05H 1/00
(52) U.S. Cl. ............................................. 156/345; 118/728
(58) Field of Search ...................................... 156/345, 637, 156/647; 216/91, 83; 134/34, 60, 94.1, 114, 135; 250/306; 437/225, 230; 427/2.1, 2.11; 118/728; 73/31.04, 747, 299

(56) References Cited

U.S. PATENT DOCUMENTS

| | | | |
|---|---|---|---|
| 5,275,690 | * 1/1994 | Garwood, Jr. ........................ 156/637 |
| 5,437,757 | * 8/1995 | Rice et al. ............................ 118/728 |
| 5,542,559 | * 8/1996 | Kawakami et al. .................. 118/728 |
| 5,695,566 | * 12/1997 | Suzuki et al. ........................ 118/728 |

* cited by examiner

*Primary Examiner*—Gregory Mills
*Assistant Examiner*—Parviz Hassanzadeh
(74) *Attorney, Agent, or Firm*—Adams & Wilks

(57) ABSTRACT

A semiconductor manufacturing device comprises a holder having sealing members and supporting a semiconductor substrate so that an open space is formed above the semiconductor substrate and a sealed space is formed below the semiconductor substrate. The semiconductor substrate has a first main surface exposed to the open space and a second main surface exposed to the sealed space. When the holder is immersed in an etching solution, the first main surface of the semiconductor substrate is exposed to the etching solution and subjected to wet etching while the etching solution does not flow into the sealed space.

24 Claims, 4 Drawing Sheets

SEMICONDUCTOR MANUFACTURING DEVICE

BACKGROUND OF THE INVENTION

The present invention relates to a semiconductor manufacturing device for performing wet etching only on one main surface of a semiconductor substrate, particularly a semiconductor manufacturing device suitable for producing a cantilever used for a probe of a scanning probe microscope.

In a scanning probe microscope represented by an atomic force microscope (AFM), a cantilever in which an exploring needle is formed at a free end of a beam portion is used as a scanning probe. In the configuration, because attraction or repulsion based on interatomic force appears between a surface of a sample and the exploring needle by scanning the exploring needle on the surface of the sample, a shape of the surface of the sample can be measured by detecting the interatomic force as a deflection of the cantilever.

FIGS. 7A to 7D are sectional views showing a method of processing the conventional cantilever as a specimen. First as shown in FIG. 7a, layered substrate 3 is prepared, which is layered with a $SiO_2$ film 30, a silicon thin film 31 acting as a beam portion of the cantilever and an exploring needle, a $SiO_2$ film 32 as an intermediate layer, a silicon substrate 33 acting as a supporting table of the cantilever, and a $SiO_2$ film 34.

Next, a beam portion 31a of the cantilever and an exploring needle 31b are formed on a surface of the $SiO_2$ film 34 by etching $SiO_2$ film 30 into a proper shape so as to become a protecting film and by etching the silicon substrate 31 as the mask of the protecting film as shown in FIG. 7B. Moreover, $SiO_2$ film 34 is properly etched so as to form a protecting film 34a, and surface <100> of the silicon substrate 33 is exposed.

Next, an end portion of layered substrate 3 is supported with a jig (etching holder) 50 sealed with an O-ring 51 for preventing inflow of liquid so that only the other main surface where said beam portion 31a and the exploring needle 31b of the layered substrate 3 is not formed is exposed by etching solution as shown in FIG. 7C. $SiO_2$ film 32 exposes by etching the silicon substrate 33 as a mask of the protecting film 34 (34a) using anisotropic wet-etching.

For the etching solution, a potassium hydroxide (KOH) aqueous solution of 40 percentage by weight at 60 to 80° C. a tetraalkylammonium hydroxide (TMAH) aqueous solution of 20 percentage by weight at 80 to 90° C., and so on can be used. With these etching solutions, plane <100> of the silicon substrate 33 is etched much faster than plane <111> so that the protecting film 34a is not actually etched. Therefore, anisotropic wet-etching actually stops at plane <111> referenced with the end of the protecting film 34a. At the end, the extra $SiO_2$ film 32 is removed as shown in FIG. 7D. By the above-described process, a cantilever is completed which has an exploring needle 31b at one end of the beam portion 31a and the other portion thereof is supported by a cantilever-like supporting table 60.

In the above-mentioned prior art, pressure increases corresponding to the depth of the etching solution at a processing plane of layered substrate 3 while pressure in the etching holder 50 is substantially at atmospheric pressure when the etching holder 50 holding the layered substrate 3 is sunk in the etching solution. Because of that, there has been problems that etching is performed unevenly and the substrate itself is broken by stress corresponding to a difference in pressure applied to both main surfaces.

When temperature of etching solution, gas in the etching holder 50 gradually expands thermally, and pressure applying to non-processing surface of the layered substrate 3 gradually increases. There has been a problem that stress toward reverse direction to the above-mentioned appears at the layered substrate 3 when pressure applied to the non-processing surface becomes higher than pressure applied to a processing surface corresponding to depth in the etching solution.

An object of the present invention is to provide a semiconductor manufacturing device substantially adjusting pressure applied to a non-processing surface to a processing surface of a semiconductor substrate in wet-etching in which the processing surface of the semiconductor substrate is exposed outside and the non-processing surface is sunk in etching solution so as to be sealed from outside preventing from inflow of the solution to solve the above-mentioned problem in the prior art.

SUMMARY OF THE INVENTION

To achieve the above-mentioned object, the present invention is characterized by providing a substrate holding member for holding the semiconductor substrate so that one main surface of the substrate exposes outside and the other main surface exposes in a space sealed to prevent inflow of liquid from outside, and a pressure control means for controlling pressure in said space so that similar pressure as pressure applied to the one main surface of said semiconductor substrate is applied to the other main surface in performing wet etching only on the one main surface of the semiconductor substrate.

According to the above-mentioned configuration, since similar pressure as pressure applied to one main surface is applied to the other main surface of the semiconductor substrate, stress caused by difference of pressure applying to each main surface does not appear at the semiconductor substrate.

DETAILED DESCRIPTION OF THE PREFERRED EMBODIMENTS

Figure 1:
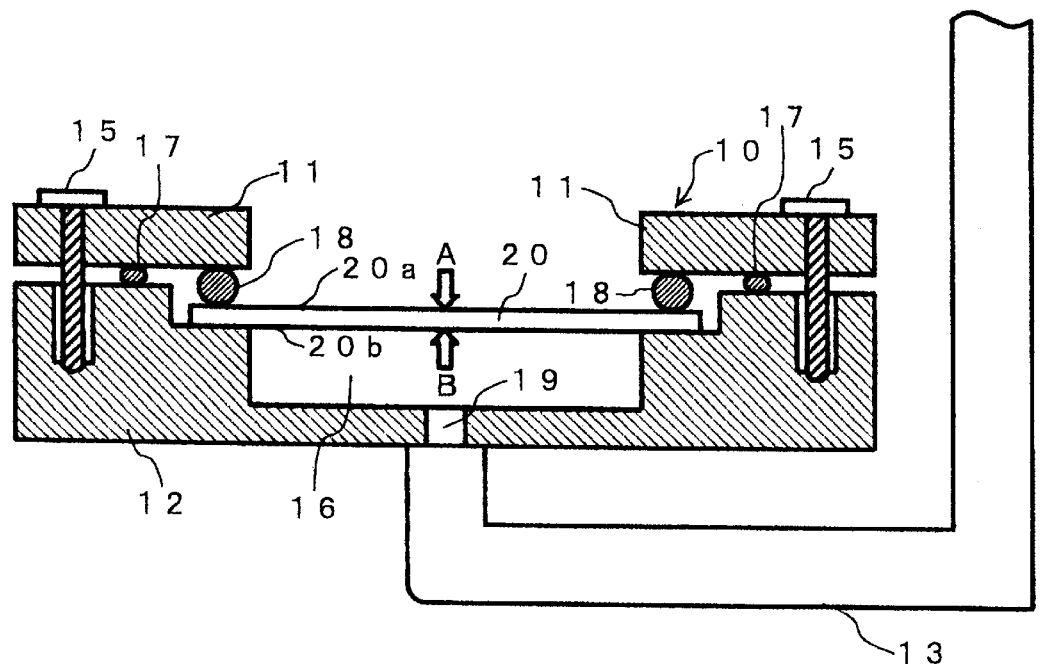
FIG. 1 is a sectional view showing a construction of main portion of an etching holder according to an embodiment of the present invention.
Figure 2:
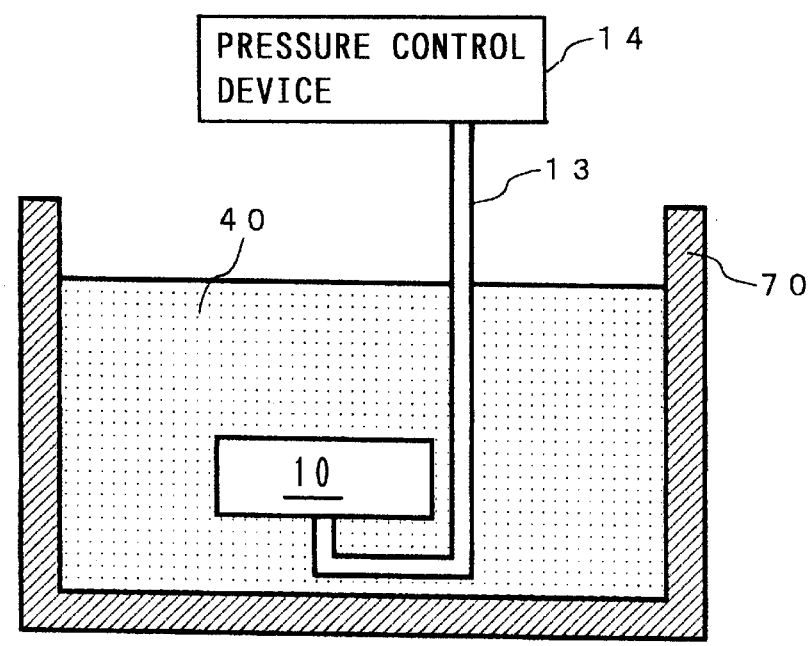
FIG. 2 is a view showing hole construction and how to use a semiconductor manufacturing device of the present invention including the etching holder.

Referring to the figures, the present invention will be described in detail. FIG. 1 is a plane view showing a construction of a main portion of an etching holder according to an embodiment of the present invention. FIG. 2 is a view showing a whole construction of and how to use of a semiconductor manufacturing device the present invention including the etching holder of FIG. 1.

An etching holder 10 of the present invention comprises a ring-shaped substrate holding member 11 having an opening portion at a center thereof, a ring-shaped substrate holding member 12 having an opening portion expanding step by step toward one main surface, and screws 15 fixing mutually each of the substrate holding members 11 and 12 through an O-ring. To an opening of said substrate holding member 12, one end of a gas passageway 13 is connected, and to the other end, pressurizing means comprised of a pressure control device 14 is connected as shown in FIG. 2.

In the configuration, a semiconductor substrate 20 exposes outside at processing surface 20a thereof and is held by the substrate holding members 11 and 12 through the O-ring 18 so that non-processing surface 20b exposes in a cavity or space 16 sealed from outside preventing inflow of the solution as shown in FIG. 1. The etching holder 10 holding the substrate holding member 20 is sunk in etching solution 40 of an etching vessel 70 as shown in FIG. 2.

In the etching solution 40, pressure A is applied to the processing surface 20a of the semiconductor substrate 20 corresponding to the depth of the etching solution 40. The pressure control device 14 applies pressure in the space 16 of the etching older 10 through gas passage 13 so that the similar pressure B as said pressure A is applied to the non-processing surface 20b of the semiconductor substrate 20.

As the pressure A applied to the processing surface 20a of the semiconductor substrate can be easily obtained as a function of position (depth) of the semiconductor substrate 20 in the etching solution 40 and the specific gravity of the etching solution 40, the pressure control device can control pressure linearly in the space 16 if the specific gravity of the etching solution and depth of the substrate are always constant.

According to the present embodiment, as the similar pressure as pressure applied to the processing surface 20a is applied to the non-processing surface 20b of the semiconductor substrate 20, stress caused by difference of pressure applied to each main surface at the semiconductor substrate 20 is prevented.

If a pressure sensor for detecting pressure applied to the processing surface 20a of said semiconductor substrate 20 is additionally formed so that said pressure control device 14 controls the application of pressure in the space 16 corresponding to an output signal of said pressure sensor, pressure applied to the non-processing surface 20b can always be controlled accurately independent of the specific gravity of the solution and depth of the substrate.

Figure 3:
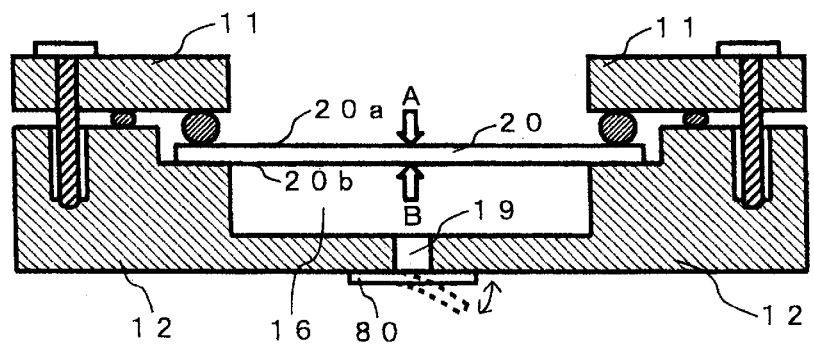
FIG. 3 is a sectional view showing a second embodiment according to the present invention.

FIG. 3 is a plane view showing a construction of a main portion of an etching holder according to a second embodiment of the present invention. The same symbols in FIGS. 1 and 2 as said symbols show the same or similar parts.

The present embodiment is characterized by that an exhaust valve 80 opening and exhausting gas in a space 16 when pressure in the space 16 is over a predetermined value is formed. The threshold value of pressure at which the exhaust valve 80 opens is previously set so that difference between pressure A applied to a processing surface 20a of a semiconductor substrate 20 and pressure B applied to a non-processing surface 20b is less than value having a bad influence to the semiconductor substrate 20.

According to the present embodiment, when pressure B applied to the non-processing surface 20b of the semiconductor substrate 20 becomes higher than pressure A applied to the processing surface being over the predetermined value by expansion of gas in the space 16 because of high temperature of the etching solution, the exhaust valve 80 opens and gas in the space 16 is exhausted so that pressure B applied to the non-processing surface 20b decreases. Therefore, stress does not appear at the semiconductor substrate even when temperature of the etching solution is high.

Figure 4:
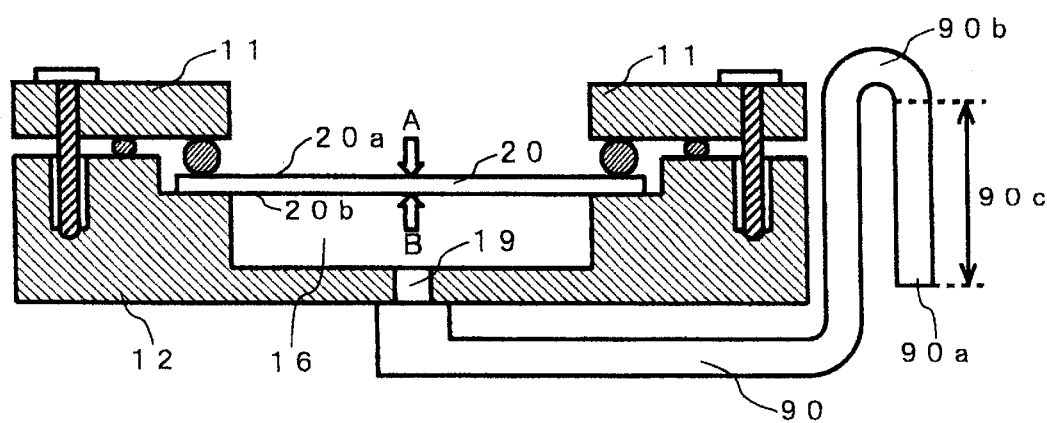
FIG. 4 is a sectional view showing a third embodiment according to the present invention.

FIG. 4 is a plane view showing a construction of a main portion of an etching holder according to a third embodiment of the present invention. The same symbols as said symbols of FIGS. 1 and 3 show the same or similar parts. The present embodiment is characterized by that a piping 90 is formed for generating pressure corresponding to a depth of a substrate in the etching solution into said space 16. One end of said piping 90 is connected in gas-tight to an opening 19 of said substrate holding member 12, and the other end leads to an opening end 90a through a U-shaped pipe portion 90b.

Figure 5:
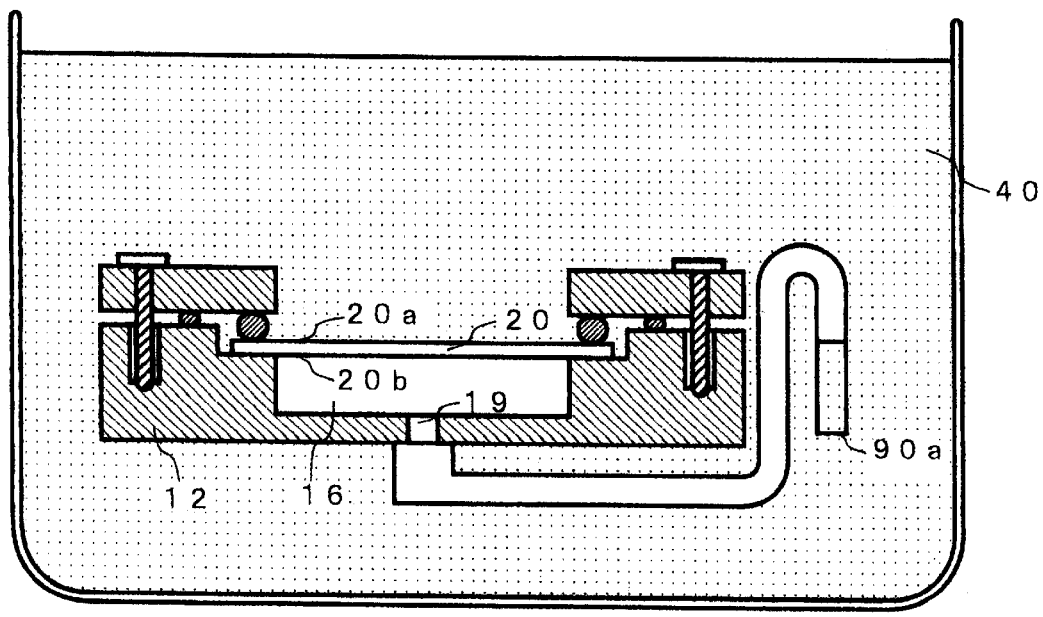
FIG. 5 is a sectional view showing how to use of the third embodiment according to the present invention.

In the configuration, etching solution flows in the piping 90 from the opening end 90a when the etching holder holding the semiconductor substrate 20 similarly as said embodiment is sunk in etching solution 40 as shown in FIG. 5. As the result, pressure corresponding to a liquid-level of the etching solution is applied to the non-processing surface 20b by the etching solution 40 flowing from the opening end 90a based on Pascal's principle.

Because of that, if the position of the opening end 90a is previously determined based on the specific gravity of the etching solution and depth of the substrate so that the liquid-level of the etching solution flowing from the opening end 90a becomes the same level as the processing surface 20b of the semiconductor substrate 20, it is possible make pressures applied to the processing surface 20a and non-processing surface 20b of the semiconductor substrate 20 substantially equal.

Although it is described that the position of the opening end 90a is previously fixed, it is possible make pressures applied to the processing surface 20a and non-processing surface 20b of the semiconductor substrate 20 substantially the same pressure without relation to the specific gravity of the etching solution by adjusting properly a distance 90c corresponding to the specific gravity of the etching solution if distance 90c between the U-shaped pipe portion 90b and the opening end 90a can be freely adjusted.

Figure 6:
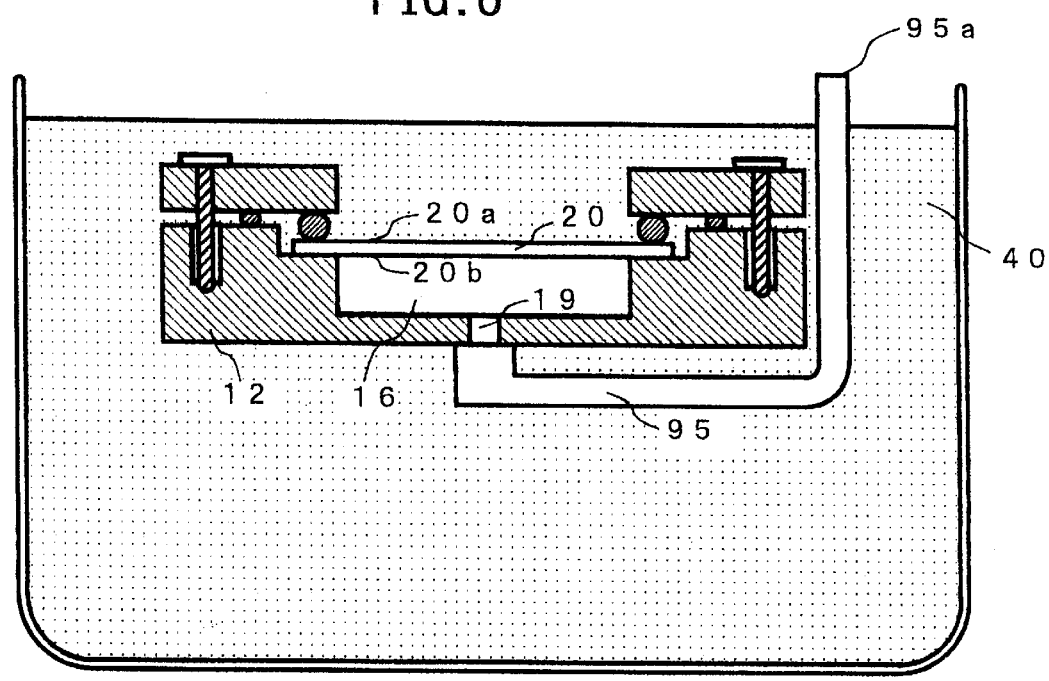
FIG. 6 is a sectional view showing a construction of and how to use a fourth embodiment according to the present invention.
Figure 7A:
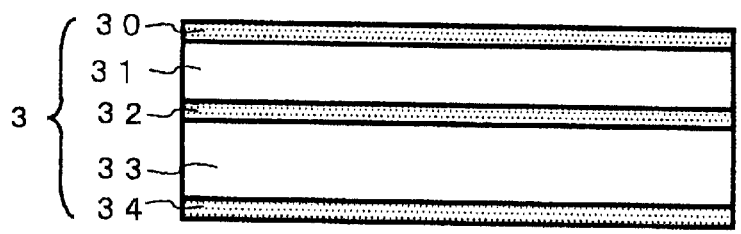
FIGS. 7A to 7D are sectional views showing a method of processing the conventional cantilever as a specimen.
Figure 7B:
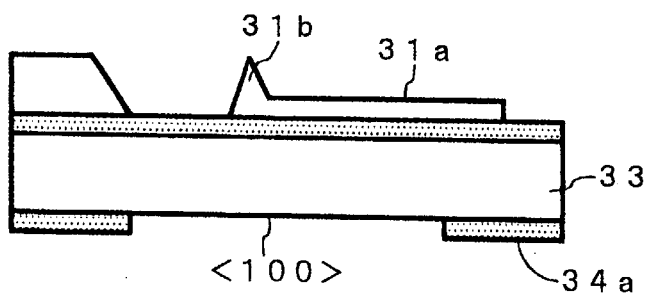
Figure 7C:
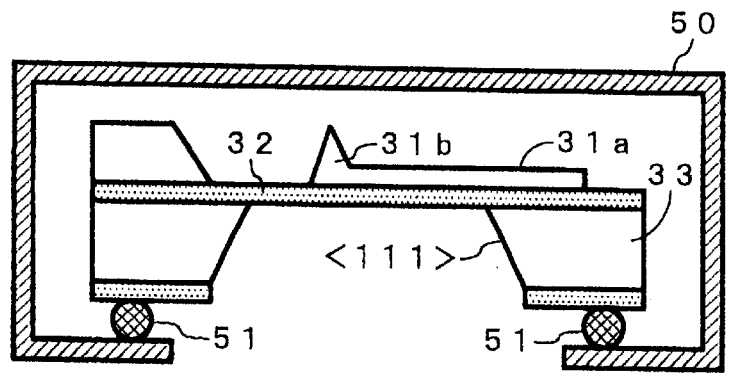
Figure 7D:
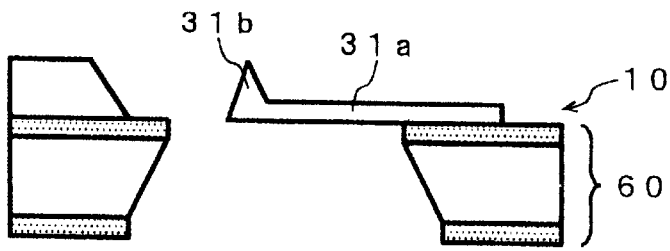

FIG. 6 is a plane view showing a construction of a main portion of an etching holder according to a fourth embodiment of the present invention. The same symbols as said symbols of the previous figures show the same or similar parts.

The present embodiment is characterized by that a piping 95 which one end thereof is connected to an opening 19 of a substrate holding member 12 in gas-tight and the other end of which is opened outside is formed. Said piping 95 is constructed so that the other end of the piping exposes in the air outside when the etching holder sunk in the etching solution 40.

According to the present embodiment, it is possible make pressures applied to the processing surface 20a and non-processing surface 20b of the semiconductor substrate 20 substantially the same pressure without relation to temperature of the etching solution 40 by holding the etching holder at a comparatively shallow position in the etching solution 40 as shown in the figure because the inside of the space 16 is always kept in atmospheric pressure even if temperature of the etching holder increases due to the etching solution 40.

According to the present invention, in the wet etching process in which the semiconductor substrate is sunk in the etching solution being held so that the processing surface thereof is exposed and the non-processing surface is sealed preventing inflow of the etching solution, pressure applied to the processing surface can be matched to pressure applied to the non-processing surface. Therefore, stress does not appears so that uneven etching and breakage of the substrate is prevented.

What is claimed is:

1. A semiconductor manufacturing device for performing wet etching on only one main surface of a semiconductor substrate, the semiconductor manufacturing device comprising:

a substrate holder for holding a semiconductor substrate to form an open space and a sealed space so that a first main surface of the semiconductor substrate is exposed to the open space and a second main surface of the semiconductor substrate opposite to the first main surface is exposed to the sealed space, and for maintaining the semiconductor substrate immersed in an etching solution so that the first main surface of the semiconductor substrate is exposed to the etching solution and subjected to wet etching and the etching solution does not flow into the sealed space; and pressure control means for controlling a pressure in the sealed space to a pressure substantially equal to a pressure applied to the first main surface of the semiconductor substrate when the semiconductor substrate is immersed in the etching solution.

2. A semiconductor manufacturing device according to claim 1; wherein the pressure control means comprises a gas passageway having one end connected with a gas-tight connection to the sealed space and a second end, and pressurizing means connected with a gas-tight connection to the second end of the gas passageway for pressurizing the sealed space through the gas passageway to maintain the pressure in the sealed space substantially equal to the pressure applied to the first main surface of the semiconductor substrate.

3. A semiconductor manufacturing device according to claim 2; further comprising a pressure sensor for detecting the pressure applied to the first main surface of the semiconductor substrate; and wherein the pressurizing means pressurizes the sealed space in accordance with the pressure detected by the pressure sensor.

4. A semiconductor manufacturing device according to claim 1; wherein the pressure control means comprises an exhaust valve for exhausting gas from the sealed space to the exterior of the semiconductor manufacturing device when the pressure in the sealed space exceeds a predetermined value.

5. A semiconductor manufacturing device according to claim 1; wherein the pressure control means comprises a piping having a first end connected to the sealed space with a gas-tight connection and a second end opposite the first end; wherein when the semiconductor substrate is maintained immersed in the etching solution by the substrate holder the piping is also immersed in the etching solution so that a pressure substantially equal to the pressure applied to the first main surface of the semiconductor substrate is applied to the sealed space by the etching solution through the piping.

6. A semiconductor manufacturing device according to claim 1; wherein the pressure control means comprises a piping having a first end connected to the sealed space with a gas-tight connection and a second end opposite the first end; wherein when the semiconductor substrate is maintained immersed in the etching solution by the substrate holder the second end of the piping is exposed to air pressure outside of the etching solution.

7. A semiconductor manufacturing device according to claim 1; wherein the substrate holder comprises a first holding member and a second holding member connected to the first holding member for holding the semiconductor substrate, the first holding member having a central opening for exposing the first main surface of the semiconductor substrate to the etching solution, and the second holding member having a step portion for supporting the semiconductor substrate and a cavity corresponding to the sealed space.

8. A semiconductor manufacturing device according to claim 7; wherein each of the first and second holding members is generally ring-shaped.

9. A semiconductor manufacturing device according to claim 7; wherein the substrate holder further comprises first and second sealing members for preventing the inflow of etching solution into the sealed space, the first sealing member providing a liquid-tight seal between an outer peripheral portion of the first main surface of the semiconductor substrate and the first holding member, and the second sealing member providing a liquid-tight seal between the first and second holding members.

10. A semiconductor manufacturing device according to claim 9; wherein each of the first and second sealing members comprises an O-ring.

11. A semiconductor manufacturing device according to claim 10; wherein each of the first and second holding members is generally ring-shaped.

12. A semiconductor manufacturing device according to claim 9; wherein each of the first and second holding members is generally ring-shaped.

13. A semiconductor manufacturing device comprising:

a holder having an open end, a cavity, a support surface for supporting a semiconductor substrate between the open end and the cavity so that a first main surface of the semiconductor substrate is exposed to the open end and a second main surface of the semiconductor substrate opposite the first main surface is exposed to the cavity, and sealing means for sealing the cavity to prevent the inflow of an etching solution into the cavity when the holder supporting the semiconductor substrate is immersed in the etching solution while the etching solution is allowed to pass through the open end to subject the first main surface of the semiconductor substrate to wet etching; and pressure control means for controlling a pressure in the sealed cavity to a value substantially equal to a pressure applied to the first main surface of the semiconductor substrate when the holder supporting the semiconductor substrate is immersed in the etching solution.

14. A semiconductor manufacturing device according to claim 13; wherein the pressure control means comprises a gas passageway having one end connected with a gas-tight connection to the sealed cavity and a second end, and pressurizing means connected with a gas-tight connection to the second end of the gas passageway for pressurizing the sealed cavity through the gas passageway to maintain the pressure in the sealed cavity substantially equal to the pressure applied to the first main surface of the semiconductor substrate.

15. A semiconductor manufacturing device according to claim 14; further comprising a pressure sensor for detecting the pressure applied to the first main surface of the semiconductor substrate; and wherein the pressurizing means pressurizes the sealed space in accordance with the pressure detected by the pressure sensor.

16. A semiconductor manufacturing device according to claim 13; wherein the pressure control means comprises an exhaust valve for exhausting gas from the sealed cavity to the exterior of the semiconductor manufacturing device when the pressure in the sealed cavity exceeds a predetermined value.

17. A semiconductor manufacturing device according to claim 13; wherein the pressure control means comprises a piping having a first end connected to the sealed cavity with a gas-tight connection and a second end opposite the first end; wherein when the semiconductor substrate is maintained immersed in the etching solution by the substrate holder the piping is also immersed in the etching solution so that a pressure substantially equal to the pressure applied to the first main surface of the semiconductor substrate is applied to the sealed cavity by the etching solution through the piping.

18. A semiconductor manufacturing device according to claim 13; wherein the pressure control means comprises a piping having a first end connected to the sealed cavity with a gas-tight connection and a second end opposite the first end; wherein when the semiconductor substrate is maintained immersed in the etching solution by the substrate holder the second end of the piping is exposed to the exterior of the semiconductor manufacturing device and the etching solution.

19. A semiconductor manufacturing device according to claim 13; wherein the holder comprises a first holding member having the open end, and a second holding member having the cavity and the support surface and connected to the first holding member.

20. A semiconductor manufacturing device according to claim 19; wherein each of the first and second holding members is generally ring-shaped.

21. A semiconductor manufacturing device according to claim 19; wherein the sealing means comprises a first sealing member for providing a liquid-tight seal between an outer peripheral portion of the first main surface of the semiconductor substrate and the first holding member, and a second sealing member for providing a liquid-tight seal between the first and second holding members.

22. A semiconductor manufacturing device according to claim 21; wherein each of the first and second sealing members comprises an O-ring.

23. A semiconductor manufacturing device according to claim 21; wherein each of the first and second holding members is generally ring-shaped.

24. A semiconductor manufacturing device according to claim 20; wherein each of the first and second holding members is generally ring-shaped.

* * * * *